United States Patent [19]

Minamikawa et al.

[11] Patent Number: 5,763,346
[45] Date of Patent: Jun. 9, 1998

[54] DIELECTRIC CERAMIC COMPOSITION

[75] Inventors: Tadahiro Minamikawa; Akira Ando, both of Shiga-ken, Japan

[73] Assignee: Murata Manufacturing Co., Ltd., Kyoto, Japan

[21] Appl. No.: 899,584

[22] Filed: Jul. 24, 1997

[30] Foreign Application Priority Data

Jul. 26, 1996 [JP] Japan .................. 8-197701

[51] Int. Cl.$^6$ .................. C04B 35/495; C04B 35/453
[52] U.S. Cl. .................. 501/135
[58] Field of Search .................. 501/135

[56] References Cited

U.S. PATENT DOCUMENTS 4,978,646  12/1990  Bardhan et al. .................. 501/134
5,273,944  12/1993  Kagata et al. .................. 501/135
5,457,076  10/1995  Katagiri et al. .................. 501/35

FOREIGN PATENT DOCUMENTS 2438910  2/1975  Germany .................. 501/135

*Primary Examiner*—David Brunsman
*Attorney, Agent, or Firm*—Ostrolenk, Faber, Gerb & Soffen, LLP

[57] ABSTRACT

Disclosed is a dielectric ceramic composition consisting essentially of a main component of $(Sr_{1-x}K_x)_2 (Na_{1-x}Bi_x) Nb_5O_{15}$ with x being from about 0.1 to 0.35, and containing at least one of Cr, Mn, Fe, Co and Ni in an amount of from about 0.02 to 2.0% by weight relative to the main component and in terms of $CrO_2$, $MnO_2$, $Fe_2O_3$, CoO and NiO. The composition contains neither Pb nor Ba, but has a specific inductive capacity comparable to that of $BaTiO_3$-type dielectric materials. The temperature-dependent variation in the specific inductive capacity of the composition is low. The composition is suitable for use in capacitors.

7 Claims, No Drawings

DIELECTRIC CERAMIC COMPOSITION

FIELD OF THE INVENTION

The present invention relates to a dielectric ceramic composition.

BACKGROUND OF THE INVENTION

As dielectric materials for ceramic capacitors, in general, used are various materials comprising, for example, $Pb(Mg_{1/3}Nb_{2/3})O_3$-$PbTiO_3$ (hereinafter referred to as PMN-PT) or $BaTiO_3$.

However, since PMN-PT-type dielectric materials emit Pb vapor during baking, they must be so formulated as to compensate for the Pb loss. In addition, they often react with molds. On the other hand, $BaTiO_3$-type materials generally require high baking temperatures (about 1300° C. or so), thereby causing an increase in the baking cost. Therefore, dielectric materials containing neither Pb nor $BaTiO_3$ are desired.

SUMMARY OF THE INVENTION

The object of the present invention is to provide a dielectric ceramic composition suitable for capacitors which contains neither Pb nor $BaTiO_3$, while having a specific inductive capacity comparable to that of $BaTiO_3$-type dielectric materials, and is characterized in that the temperature-dependent variation in its specific inductive capacity is small.

The dielectric ceramic composition of the present invention consists essentially of a main component of a general formula, $(Sr_{1-x}K_x)_2(Na_{1-x}Bi_x)Nb_5O_{15}$ with x of about 0.1 to 0.35, and contains at least one of Cr, Mn, Fe, Co and Ni in an amount of from about 0.02 to 2.0% by weight relative to the main component and in terms of $CrO_2$, $MnO_2$, $Fe_2O_3$, CoO and NiO.

As having the compositional constitution mentioned above, the dielectric ceramic composition of the present invention has a Curie point near to room temperature, and the peak of the specific inductive capacity pattern of the composition has gentle slopes. As a result, the specific inductive capacity of the composition falls between 2200 and 3600 or so at room temperature, and the temperature-dependent variation in the specific inductive capacity of the composition is small.

PREFERRED MODES OF CARRYING OUT THE INVENTION

Now, the present invention is described below with reference to Examples. EXAMPLES:

First prepared were raw materials of $SrCO_3$, $Bi_2O_3$, $Nb_2O_5$, $K_2CO_3$, $Na_2CO_3$ and $MnO_2$.

These were weighed in accordance with the value x and the proportion of $MnO_2$ indicated in Table 1, and mixed to give ceramic compositions each consisting essentially of $(Sr_{1-x}K_x)_2(Na_{1-x}Bi_x)Nb_5O_{15}$ and containing the additive of $MnO_2$. In Table 1, the samples marked with (*) are outside the scope of the present invention.

TABLE 1

| Sample No. | Value of x | Additive $MnO_2$ (wt. %) | $\epsilon$ | tan δ (%) | p (Ω·cm) ($\times 10^{12}$) | Temperature Dependent Variation in Capacitance (%) | | Degree of DC Field Dependence of Capacitance (%) |
|---|---|---|---|---|---|---|---|---|
| | | | | | | Maximum | Minimum | |
| *1 | 0 | 0.5 | 1100 | 12.0 | 0.8 | +15 | −3 | 5 |
| *2 | 0.05 | 0.5 | 1730 | 9.1 | 1.2 | +14 | −4 | 5 |
| 3 | 0.10 | 0.5 | 2500 | 7.0 | 1.6 | +13 | −6 | 5 |
| 4 | 0.15 | 0.5 | 3130 | 9.4 | 1.6 | +24 | −15 | 4 |
| 5 | 0.20 | 0.5 | 3530 | 9.4 | 2.5 | +12 | −22 | 2 |
| 6 | 0.225 | 0.5 | 3570 | 7.4 | 6.3 | +3 | −22 | 1 |
| 7 | 0.25 | 0.5 | 3250 | 4.9 | 11.6 | 0 | −20 | 0 |
| 8 | 0.275 | 0.5 | 3010 | 4.0 | 10.0 | 0 | −22 | 0 |
| 9 | 0.30 | 0.5 | 2670 | 3.4 | 7.9 | +1 | −21 | 0 |
| 10 | 0.35 | 0.5 | 2220 | 3.0 | 6.3 | +1 | −18 | 0 |
| *11 | 0.40 | 0.5 | 1770 | 3.1 | 6.0 | +5 | −16 | 0 |
| 12 | 0.25 | 0.02 | 3060 | 9.0 | 9.8 | +1 | −20 | 0 |
| 13 | 0.25 | 2.0 | 2380 | 5.5 | 8.5 | +2 | −22 | 1 |
| *14 | 0.25 | 2.5 | 1800 | 7.0 | 8.0 | +1 | −20 | 0 |
| *15 | 0.25 | 0.01 | | | | Not sintered. | | |
| *16 | 0.25 | None | | | | Not sintered. | | |

To each mixture was added alcohol in an amount of two times by weight of the mixture, followed by being wet-milled in a ball mill for about 5 hours, dried, and calcined in air at from 700° to 900° C.

The thus-calcined mixture was roughly ground, then wet-milled along with a predetermined amount of an organic binder added thereto, for from 5 to 10 hours, dewatered, and thereafter passed through a 40-mesh sieve.

The grains were then shaped under a pressure of from 750 to 1000 kg/cm² into discs having a diameter of 12 mm and a thickness of 1.2 mm each, and the resulting discs were baked in air at from 1100° to 1200° C. Thus were obtained herein various dielectric ceramic discs.

A silver electrode paste was applied to the both surfaces of each disc to form thereon silver electrodes, and baked. Thus were obtained various ceramic capacitor discs.

These ceramic capacitor discs were tested for their electric characteristics, in the manner mentioned below.

The capacitance of each sample was measured at a temperature of 20° C., at a frequency of 1 kHz and at a voltage of 0.5 V, from which was obtained the specific inductive capacity ($\epsilon$) thereof through calculation relative to the area of the electrode and the thickness of the sample. The dielectric loss (tan δ) was measured under the same conditions as those for the specific inductive capacity. A DC voltage of 100 V was applied to each sample at a temperature of 20° C. for 30 seconds to measure its resistance value, from which was obtained the resistivity (ρ) thereof through calculation relative to the dimension of the sample. The temperature-dependent characteristics of the capacitance of each sample were obtained as follows: The capacitance of each sample was measured at −25° C., 0° C., +20° C., +40° C., +60° C. and +85° C., at a frequency of 1 kHz and an AC voltage of 0.5 V, the variation in the capacitance at each of said measuring temperatures was obtained relative to the capacitance at 20° C., and the maximum and minimum values of the temperature-dependent variation were obtained. The degree of DC field dependence of the capacitance of each sample (which indicates the degree of reduction in the capacity of each sample) was obtained as follows: Each sample was left in a DC field of 1 kV/mm in which its capacitance at a frequency of 1 kHz and an AC voltage of 0.5 V was measured. Based on its capacitance in a DC field of 0 V/mm, the degree of DC field dependence of the capacitance of each sample was obtained from the value thus measured.

Table 1 shows the data of the electric characteristics of the samples thus measured in the manner as above, along with the value of x and the proportion of $MnO_2$ added.

As is seen from these data, the samples of the present invention all have a specific inductive capacity falling between 2220 and 3570, which is comparable to that of $BaTiO_3$-type dielectric materials, and the degree of DC field dependence of the capacitance of these samples (which indicates the degree of reduction in the capacity of the samples) and also the temperature-dependent variation in the capacitance thereof are relatively low.

Now, the reasons for defining the compositional region of the dielectric ceramic composition of the present invention are referred to herein.

If x is lower than about 0.10 as in Sample No. 2 or if x is higher than about 0.35 as in Sample No. 11, such is unfavorable since the specific inductive capacity of the composition is low and the composition could not have practicable characteristics that are comparable to those of $BaTiO_3$-type dielectric materials. Therefore, the range of x is preferably about 0.1 to 0.35, and more preferably about 0.15–0.3.

For the additive $MnO_2$, if its amount is lower than about 0.02% by weight as in Sam. No. 15, the ceramic could not be sintered; but if its amount is higher than about 2.0% by weight as in Sample No. 14, the specific inductive capacity of the composition is unfavorably low. Therefore, the amount of the additive is preferably from 0.02 to 2.0% by weight, and more preferably about 0.05–1.5.

In the above-mentioned Examples, $MnO_2$ was used as the additive. Apart from $MnO_2$, at least one of $CrO_2$, $Fe_2O_3$, CoO, NiO and $MnO_2$ can be effectively added to the composition of the invention to attain the same results.

As has been mentioned hereinabove, the dielectric ceramic composition of the present invention has, though containing neither Pb nor Ba, a specific inductive capacity of from 2200 to 3600 or so, which is comparable to that of $BaTiO_3$-type dielectric materials, and the temperature-dependent variation in the specific inductive capacity of the composition is favorably low. In addition, the composition has other various excellent characteristics.

Accordingly, the composition of the invention is favorably used as a dielectric material to give small-sized ceramic capacitors such as monolithic ceramic capacitors having large capacitance.

While the invention has been described in detail and with reference to specific embodiments thereof, it will be apparent to one skilled in the art that various changes and modifications can be made therein without departing from the spirit and scope thereof.

What is claimed is:

1. A dielectric ceramic composition consisting essentially of a main component of a general formula:

$(Sr_{1-x}K_x)_2(Na_{1-x}Bi_x)Nb_5O_{15}$ wherein x is about 0.10 to 0.35, and containing at least one member of the group consisting of Cr, Mn, Fe, Co and Ni in an amount of from about 0.02 to 2.0% by weight relative to the main component and in terms of $CrO_2$, $MnO_2$, $Fe_2O_3$, CoO and NiO.

2. A dielectric ceramic composition according to claim 1 wherein x is about 0.15–0.3.

3. A dielectric ceramic composition according to claim 2 wherein the amount of the member of the group is about 0.05–1.5.

4. A dielectric ceramic composition according to claim 3 wherein the member of the group is Mn.

5. A dielectric ceramic composition according to claim 1 wherein the amount of the member of the group is about 0.05–1.5.

6. A dielectric ceramic composition according to claim 5 wherein the member of the group is Mn.

7. A dielectric ceramic composition according to claim 1 wherein the member of the group is Mn.

* * * * *